US008456329B1

(12) United States Patent
Tran et al.

(10) Patent No.: US 8,456,329 B1
(45) Date of Patent: Jun. 4, 2013

(54) WAND CONTROLLER FOR AIRCRAFT MARSHALING

(75) Inventors: Nghia Tran, San Diego, CA (US); Hoa Phan, Escondido, CA (US); Tu-Anh Ton, San Diego, CA (US); John D. Rockway, San Diego, CA (US); Anthony Ton, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 423 days.

(21) Appl. No.: 12/792,885

(22) Filed: Jun. 3, 2010

(51) Int. Cl.
*H03M 11/00* (2006.01)

(52) U.S. Cl.
USPC .............. 341/20; 362/102; 362/186; 362/800

(58) Field of Classification Search
USPC ............................ 341/20; 362/102, 186, 800
See application file for complete search history.

(56) References Cited

U.S. PATENT DOCUMENTS

| | | | | |
|---|---|---|---|---|
| 5,036,442 | A | 7/1991 | Brown | |
| 5,392,203 | A * | 2/1995 | Harris, Jr. | 362/186 |
| 5,622,423 | A * | 4/1997 | Lee | 362/186 |
| 5,642,931 | A | 7/1997 | Gappelberg | |
| 5,714,698 | A | 2/1998 | Tukloka | |
| 6,293,684 | B1 | 9/2001 | Riblett | |
| 6,294,985 | B1 | 9/2001 | Simon | |
| 6,494,882 | B1 * | 12/2002 | Lebouitz et al. | 606/45 |
| 6,561,119 | B1 * | 5/2003 | Rigitano | 116/63 P |
| 6,577,299 | B1 | 6/2003 | Schiller | |
| 6,747,599 | B2 | 6/2004 | McEwan | |
| 6,903,730 | B2 | 6/2005 | Mathews | |
| 7,050,606 | B2 | 5/2006 | Paul | |
| 7,257,255 | B2 | 8/2007 | Pittel | |
| 7,267,453 | B2 | 9/2007 | Chang | |
| 7,279,646 | B2 | 10/2007 | Xu | |
| 7,287,874 | B2 * | 10/2007 | Irisawa | 362/233 |
| 7,289,645 | B2 | 10/2007 | Yamamoto | |
| 7,397,469 | B2 | 7/2008 | Vablais | |
| 7,460,011 | B1 * | 12/2008 | Liau et al. | 340/539.1 |
| 7,500,917 | B2 * | 3/2009 | Barney et al. | 463/37 |
| 7,606,411 | B2 | 10/2009 | Venetsky | |
| 7,737,867 | B2 * | 6/2010 | Arthur et al. | 340/980 |
| 8,058,975 | B2 * | 11/2011 | Barnardo et al. | 340/12.3 |
| 8,240,599 | B2 * | 8/2012 | Edelson et al. | 244/50 |
| 2004/0118945 | A1 | 6/2004 | Russell | |
| 2004/0143512 | A1 | 7/2004 | Sturr | |
| 2004/0179352 | A1 * | 9/2004 | Anderson et al. | 362/109 |
| 2006/0279549 | A1 | 12/2006 | Zhang | |
| 2007/0176898 | A1 | 8/2007 | Suh | |
| 2007/0268278 | A1 | 11/2007 | Paratore | |
| 2009/0265671 | A1 | 10/2009 | Sachs | |
| 2010/0013944 | A1 | 1/2010 | Venetsky | |

* cited by examiner

*Primary Examiner* — Khai M Nguyen
(74) *Attorney, Agent, or Firm* — Kyle Eppele; Stephen E. Baldwin

(57) ABSTRACT

In one preferred embodiment, an aircraft marshaling wand controller displays aircraft marshaling instructions to a pilot on a video display monitor on-board an aircraft, such as an aircraft on an aircraft carrier. When an aircraft marshal uses arm motion gestures to form aircraft marshaling instructions for the pilot on the aircraft, the wand controller of the present invention senses or detects those gesture motions, and generates digitized command signals representative of those gesture motions made by the aircraft marshal. A wireless transceiver then transmits those digitized command signals to the aircraft for display on the video monitor for viewing by the pilot.

16 Claims, 13 Drawing Sheets

100

WAND CONTROLLER FOR AIRCRAFT MARSHALING

FEDERALLY-SPONSORED RESEARCH AND DEVELOPMENT

This invention (Navy Case No. 100,271) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

CROSS-REFERENCE TO RELATED APPLICATIONS

This application is related to US Patent Applications entitled "Static Wireless Data Glove For Gesture Processing/Recognition and Information Coding/Input", Ser. No. 12/323,986, filed Nov. 26, 2008, and "Wireless Haptic Glove for Language and Information Transference", Ser. No. 12/325,046, filed Nov. 28, 2008, both of which are assigned to the same assignee as the present application, the contents of both of which are fully incorporated by reference herein.

BACKGROUND

Aircraft marshaling is visual signaling between ground personnel and aircraft pilots on an aircraft carrier, airport or helipad. Marshaling is a one-on-one visual communication technique between an aircraft marshal and the pilot, and may be an alternative to, or additional to, radio communications between the aircraft and air traffic control. The usual attire of the aircraft marshal is a reflecting safety vest, a helmet with acoustic earmuffs, and illuminated beacons or gloves. The beacons are known as marshaling wands to provide pilots with visual gestures indicating specific instructions.

For instance, an aircraft marshal, using well known arm gesture motions, signals the pilot to keep turning, slow down, stop, and the like, leading the aircraft to its parking location, or to the runway at an airport, or to a launch position on an aircraft carrier.

The marshaling wands currently in use frequently have different colored lights to signal a pilot with marshaling instructions, such as using a yellow light with appropriate arm motions for general instructions such as turn, slow down, and the like, and then switching to a red light with appropriate arm motions to signal the pilot to stop the aircraft. Other color configurations can be used as well, such as blue, green, and amber. However, such marshaling wands do typically not provide radio communications between the aircraft marshal and the pilot. There are limitations to such marshaling wands, particularly when used on an aircraft carrier, where the very limited space and time between take-offs and landing makes radio communications between the aircraft marshal and the pilot a difficult alternative.

SUMMARY

In one preferred embodiment, an aircraft marshaling wand controller displays aircraft marshaling instructions to a pilot on a video display monitor on-board an aircraft, such as an aircraft on an aircraft carrier. When an aircraft marshal uses arm motion gestures to form aircraft marshaling instructions for the pilot on the aircraft, the wand controller of the present invention senses or detects those gesture motions, and generates digitized command signals representative of those gesture motions made by the aircraft marshal. A wireless transceiver then transmits those digitized command signals to the aircraft for display on the video monitor for viewing by the pilot.

BRIEF DESCRIPTION OF THE DRAWINGS

Throughout the several views, like elements are referenced using like reference numerals, wherein.

DETAILED DESCRIPTION OF THE EMBODIMENTS

One purpose of the present invention is to provide an input device and method for recognition of hand waves and gestures. In one embodiment, the device or apparatus can input data to personal digital assistants or computers. Also, one embodiment of the present invention provides network enabled devices to monitor gestures or motions of aircraft carrier marshaling signals, as used by landing signal officers.

Figure 1:
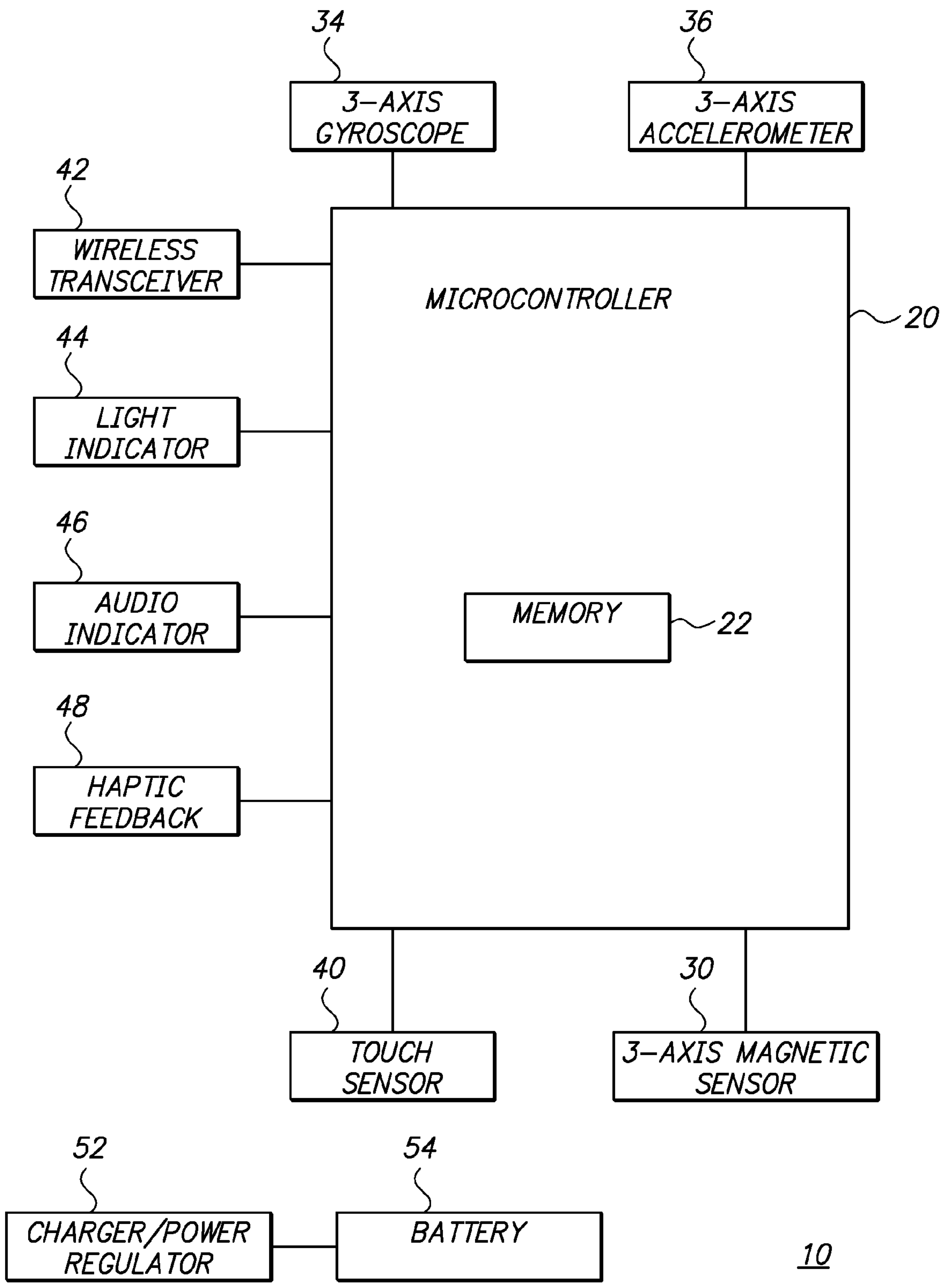
FIG. 1 shows a block diagram of a wand controller of the present invention.

FIG. 1 shows a block diagram of one embodiment of a wand controller of the present invention. In FIG. 1, the wand controller 10 includes a microcomputer (or processor) 20 with an associated memory 22. The wand controller 10 further includes a set of 3-axis magnetic sensors 30, 3-axis inertia sensors (including gyroscope sensors 34 and accelerometer sensors 36), touch sensor 40 (which includes touch sensing pads), an RF transceiver 42, and power supply unit battery 54 (associated with charger power/regulator 52. The wand controller 10 further includes light indicator 44, audio indictor 46 (with speakers for human feedback), and haptic feedback 48 (with a vibration motor, also for human feedback and tactile communications).

Figure 2A:
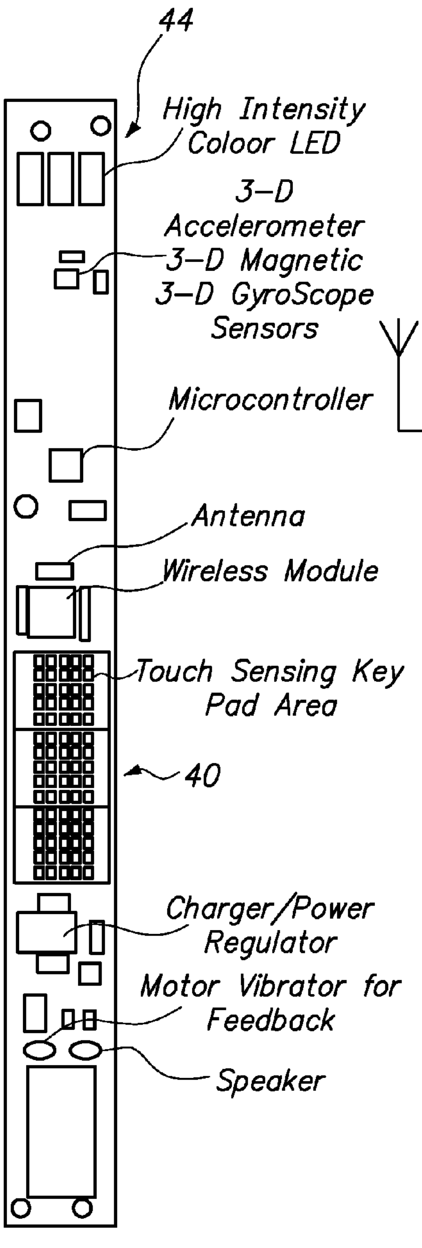
FIGS. 2A and 2B show a prototype of a wand controller of the present invention, together with a block diagram, respectively.
Figure 2B:
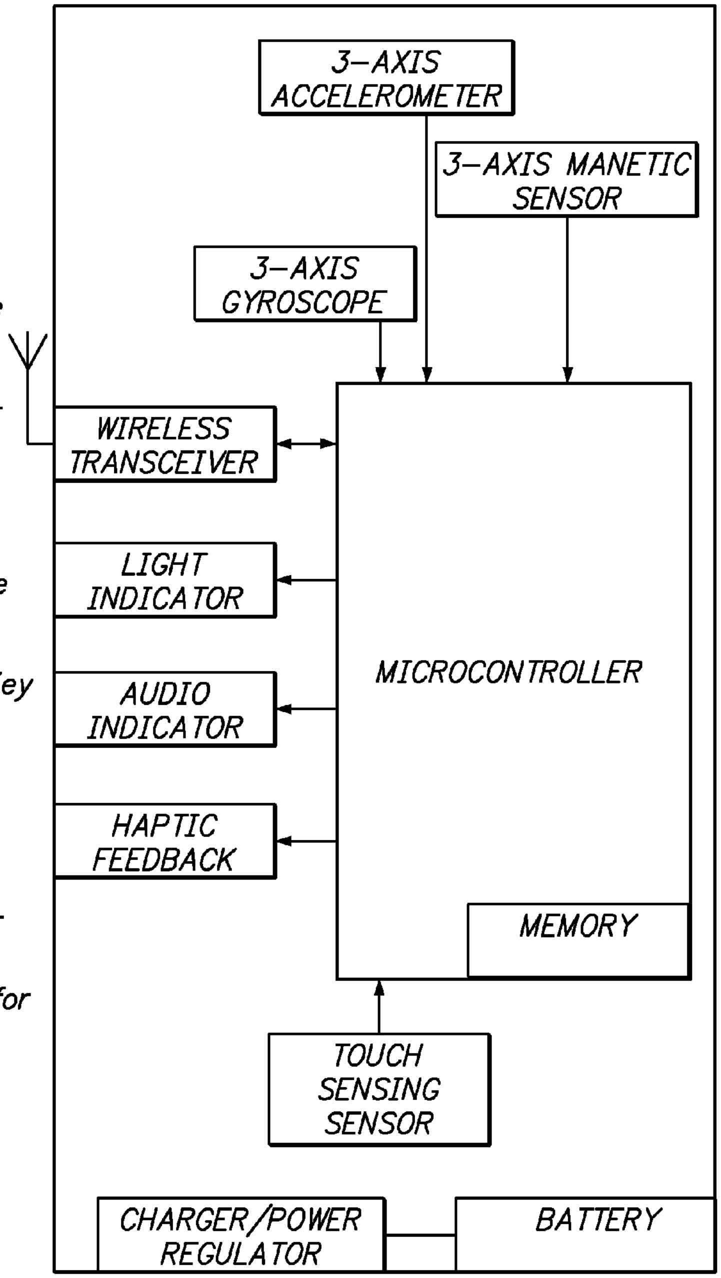

One objective of the wand controller 10 shown in FIG. 1 is for terminal support service of military aircraft on naval aircraft carriers. FIGS. 2A and 2B show a prototype of a wand controller of the present invention, together with a block diagram, respectively, where the reference numerals in FIG. 2A correspond to the block reference numerals shown in FIG.

2B. The prototype shown in FIG. 2A has as a light indicator 44 a high intensity color LED, which can alternately show different colors, such as red, yellow or green.

Figure 5A:
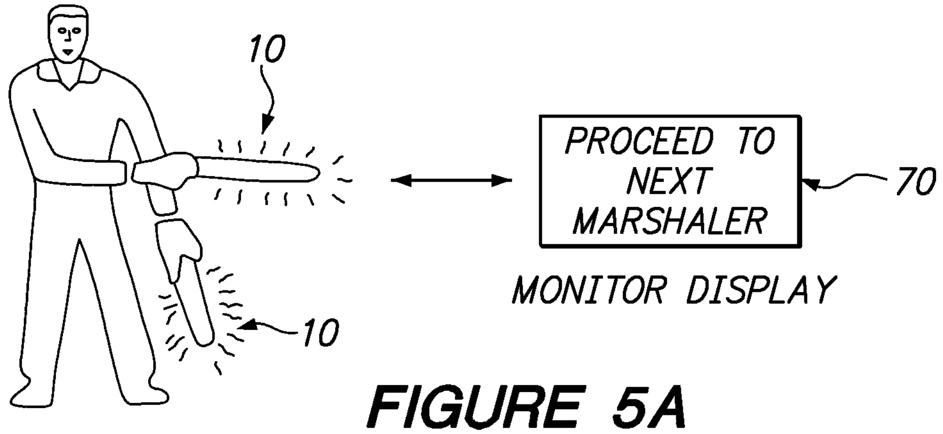
FIGS. 5A-5C show wand marshalling gesture signals as used with the wand controller of the present invention.
Figure 5B:
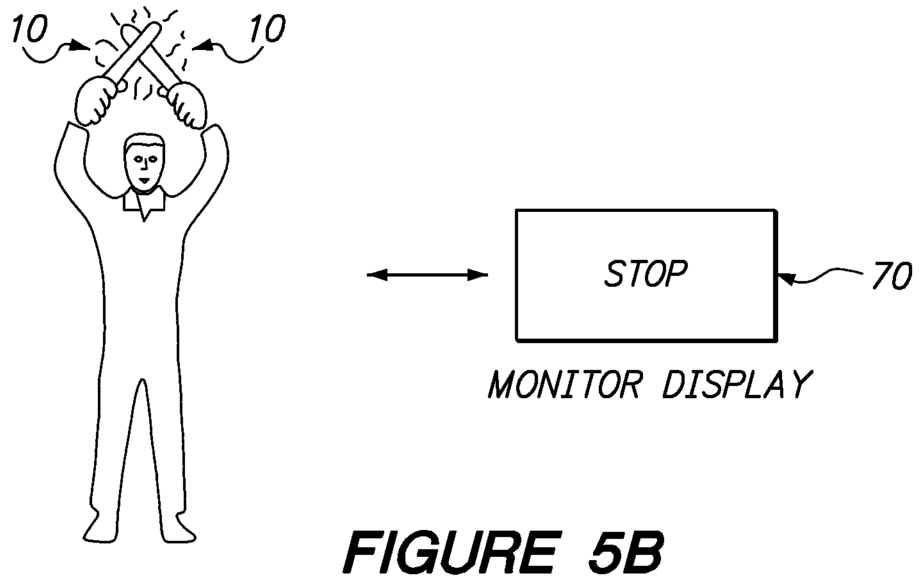
Figure 5C:
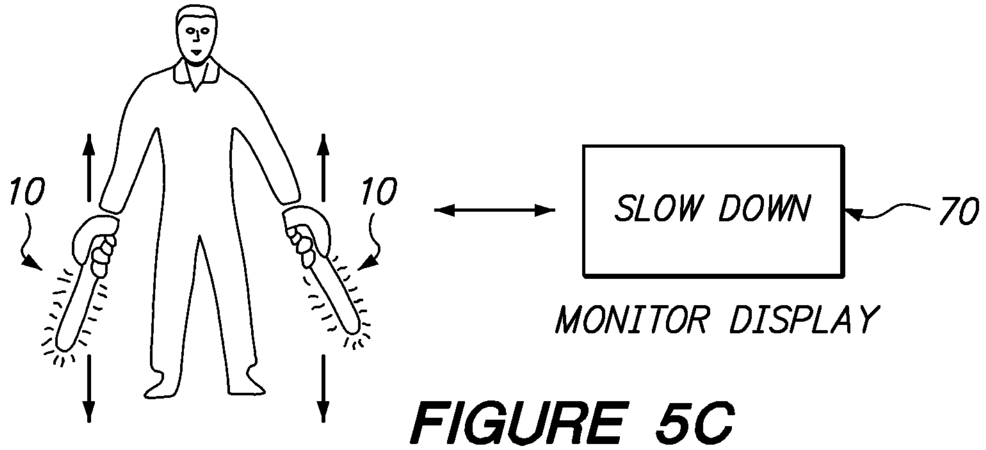

Typical aircraft marshalling signals are shown on the left hand portion of FIG. 5, where an aircraft marshal is using a pair of wand controllers 10 (from FIGS. 1 and 2). As shown in FIG. 5, the marshal gestures to form the well know signals "PROCEED TO NEXT MARSHALER", "STOP", or 'SLOW DOWN" signals to a pilot on an airplane, such as on a Navy aircraft carrier. There are many other gesture signals well know to the aircraft community, whether on an aircraft carrier, or a land tarmac at an airport.

The present invention provides, among other features, the capability to visually display the marshaling signals such as shown in FIG. 5 on a video monitor display 70 in the aircraft, as shown in the right hand portion of FIG. 5. For instance, when the marshal gestures a "STOP" signal, as shown in the left portion of FIG. 5, the cockpit video monitor 70 will simultaneously display the "STOP" signal visually to the pilot, providing an additional safety measure for instructing the pilot.

As shown in FIG. 5, the aircraft marshal uses 3-dimensional (3-D) gestures to form the "PROCEED TO NEXT MARSHALER", "STOP", or 'SLOW DOWN" signals, which are visually perceived by a pilot. The present invention processes these 3-D gesture signals to generate and transmit to the aircraft the "STOP" signal, which is then simultaneously displayed on the aircraft monitor 70, as also shown in FIG. 5.

The "PROCEED TO NEXT MARSHALER", "STOP" and "SLOW DOWN" signals shown in FIG. 5 are generated by the features of the wand controller 10 of the present invention, as well as generating other well know aircraft marshal signals. These desirable features of the present invention will now be described in more detail below, in conjunction with FIGS. 1-5.

In FIGS. 1 and 2, the sensor blocks 30, 34, 36 digitize the 3-dimensional motions of the aircraft marshal shown in the left portion FIG. 5 into discrete data. The sensor blocks detect or sense the current or changing orientation, heading and attitude of the arm motions of the aircraft marshal shown in the left hand portion of FIG. 5. For instance, the sensor blocks 30, 34, 36 of FIGS. 1 and 2 sense the gesture motions forming the "PROCEED TO NEXT MARSHALER", as distinguished from the arm gesture motions forming the "STOP' AND "SLOW DOWN" instructions shown in FIG. 5. The sensor blocks 30, 34, 36 then form discrete data representative of the respective motion gesture signals.

The discrete data is then converted into vector quantities to determine the spatial points. All of these data are processed by the microcontroller 20 through mathematical algorithms. The microcontroller 20 processes the vector quantities by calculating and translating to proper commands/words or letters.

In one embodiment, the processor or microcontroller 20 can compare the processed vector quantities with stored predetermined gesture information data in memory 22 which is representative of various command instructions, such as the "STOP", "SLOW DOWN", and "PROCEED TO NEXT MARSHALER" instructions shown in FIG. 5. The processor 20 then generates a command signal representative of a specific command for transmission to the video monitor 70 on the aircraft.

The result is transmitted (sent) via transceiver 42 of FIGS. 1 and 2 to the monitor 70 shown in FIG. 5 to display to the pilot the "PROCEED TO NEXT MARSHALER", "STOP" and "SLOW DOWN" signals on monitor 70, as examples. Many other instruction signals can be processed, transmitted and displayed as well.

Figure 6:
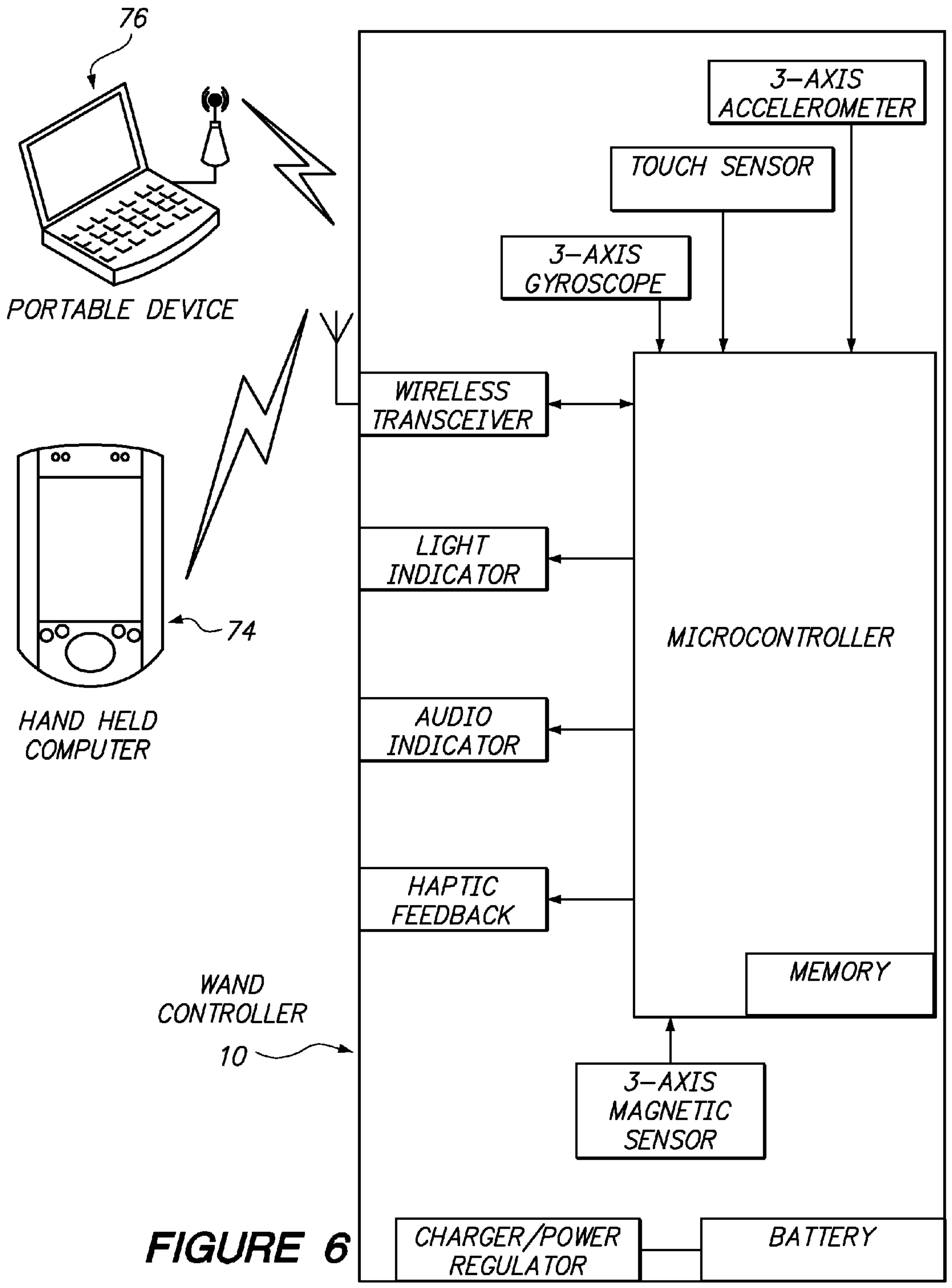
FIG. 6 shows a block diagram of the wand controller of FIG. 1 which is compatible with portable devices.

In FIG. 6, in another embodiment, the processed result can also be sent to other devices, such as a hand held device (e.g., personal digital assistant) 74 and/or computer 76 shown in FIG. 6 over a wired or wireless network, where the results are further processed. Also the results are interpreted by the microcontroller 20 of FIGS. 1 and 2 to output an indication for acknowledgements to other host devices.

Referring again to FIGS. 1 and 2, the motion detection functions include three type motion sensor functions: gyroscope (34), accelerometer (36) and magnetometer (30).

Each of the gyroscope sensors 34 are 3-axis or three-dimensional (XYZ) sensors to measure the angular rate of a gesture motion over a period of time. These angular gesture motions can be computed and yield a rotation angle, representative of the gesture motion rotation such as would occur in FIG. 5.

Each of the accelerometer sensors 36 shown in FIGS. 1 and 2 is capable of measuring the accelerated gesture motion such as shown in FIG. 5 in 3-axes (3D) of the devices accelerating in space. This accelerated gesture motion is represented as three dimensional vectors.

Each sensor of the 3 axis (3D) magnetometer sensor 30 allows the present invention to capture the motion of the wand controller shown in FIG. 5 as to what direction the wand controller 10 is pointing to relative to the North pole, which is also represented as a 3D vector component.

Figure 3A:
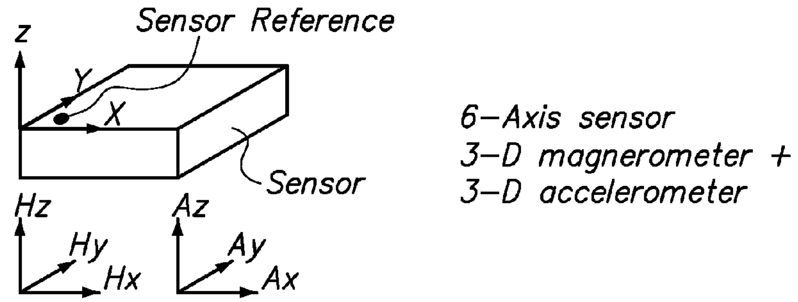
FIGS. 3A-3E show diagrams of coordinate systems of the wand controller.

FIG. 3A illustrates a 3-dimensional rectangular Cartesian coordinate system showing the assignments of the x-y-z axes for 3-dimensional magnetic field (M) vectors and accelerometer (A) field vectors. In essence, FIG. 3B provides the reference "convention" for the ensuing magnetic and gravity vectors decomposition.

Figure 3B:
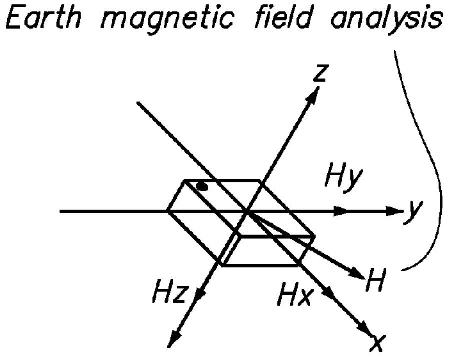
Figure 4A:
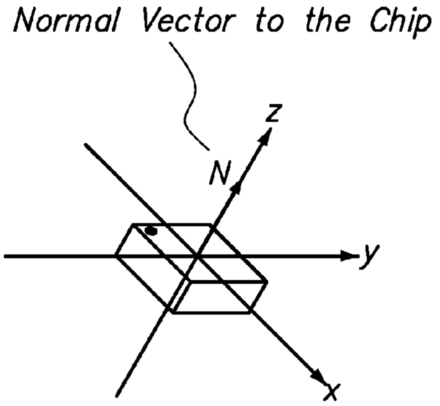
FIGS. 4A-4D show additional diagrams of coordinate systems of the wand controller.

FIG. 3B shows how a typical H-field (magnetic less the permeability) vector emanating presumably from the Earth is decomposed into its constituent component vectors Hx, Hy, Hz, using the rectangular Cartesian framework provided in FIG. 4A.

Figure 3C:
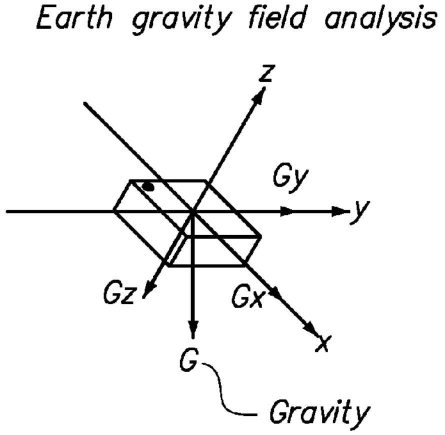

FIG. 3C shows how a typical force of gravity vector (G) is decomposed into constituent component vectors Gx, Gy, Gz, using the rectangular Cartesian framework provided in FIG. 3.

Figure 3D:
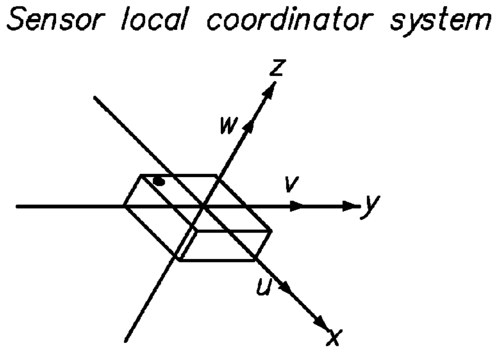
Figure 3E:
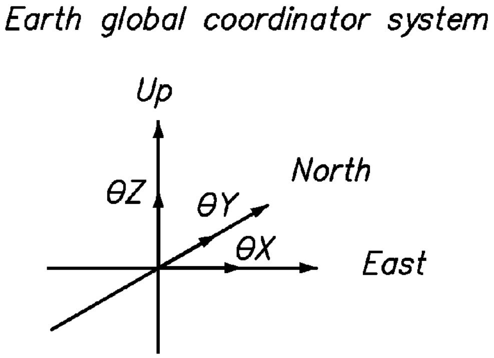

FIG. 3D shows the sensor local coordinate system using u, v, and w unit vectors as functions of the gravity vector G and magnetic field vector H. Here, sensor data is used to form the sensor local coordinate system as:

$$u=g\times h$$

$$v=w\times u$$

$$w=-g$$

where g is unit vector of G, h is unit vector H, u is unit vector parallel with the sensor x-axis, v is unit vector parallel with the sensor x-axis, and w is unit vector parallel with the sensor x-axis.

Computer calculation: Each of sensor values is read into the processor is processed as followed:

Magnetic $Hx$=Read in Magnetic $Hx$−Midpoint $Hx$

Magnetic $Hy$=Read in Magnetic $Hy$−Midpoint $Hy$

Magnetic $Hz$=Read in Magnetic $Hz$−Midpoint $Hy$

Acceleration $Ax$=Read in Acceleration $Ax$−Midpoint $Ax$ $$\text{Acceleration } Ay = \text{Read in Acceleration } Ay - \text{Midpoint } Ay$$

$$\text{Acceleration } Az = \text{Read in Acceleration } Az - \text{Midpoint } Ay$$

where Midpoint Hx, Midpoint Hy, Midpoint Hz, Midpoint Ax Midpoint Ay and Midpoint Az are the calibration data at static state.

Scaling these scalars to be Magnetic Hx, Magnetic Hy, Magnetic Hz, Acceleration Ax Acceleration Ay and Acceleration Az.

Normalizing all the above vectors to be the same size or magnitude of unit one vector Normalized Magnetic Hx Normalized Magnetic Hy Normalized Magnetic Hz Normalized Acceleration Ax Normalized Acceleration Ay Normalized Acceleration Az In FIGS. 3 and 4, we assign transformation vectors for the earth global coordinate system as below:

$$ex = [1,0,0]$$

$$ey = [0,1,0]$$

$$ez = [0,0,1],$$

where ex refers to a bearing of North, ey refers to a bearing of East, and ez refers to an orientation of "up."

FIGS. 4A-D show diagrams of coordinate systems used by the wand controller 10. FIG. 4A shows the vector N as defined as the unit normal vector to the surface of the sensor in the sensor local coordinate system. With this definition, the direction of the vector N in terms of the earth global coordinate system will be found by projecting (dot product) the vector ez onto the sensor local coordinate system:

$$N = [Nx, Ny, Nz] = [u \cdot ez, v \cdot ez, w \cdot ez],$$

which provides the scalar components for the sensor's "upward" orientation.

Figure 4B:
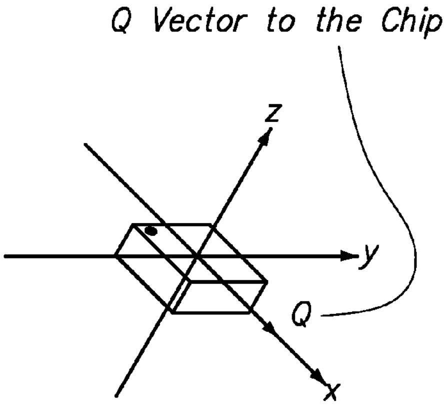

Next in FIG. 4B, we can find the sensor's "azimuthal" orientation with respect to the bearing of East, by defining a unit vector that is parallel with the y-axis of the sensor. Then the orientation of the sensor's y-axis, in terms of the earth global coordinate system can be found by projecting ey onto the sensor local coordinate system:

$$P = [Px, Py, Pz] = [u \cdot ey, v \cdot ey, w \cdot ey],$$

which provides the scalar components for the sensor's "eastward" orientation.

Figure 4C:
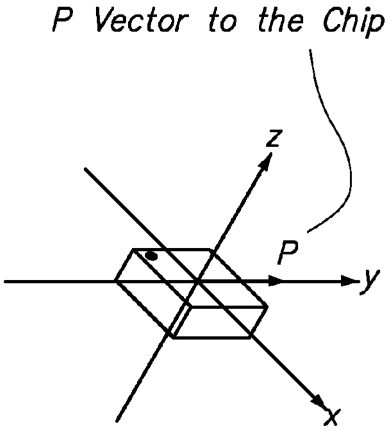

Next, in FIG. 4C, if we designate Q as a unit vector parallel with the x-axis of the sensor (bearing of North), then Q with reference to the earth global coordinate system will be found by projecting ex on to the sensor local coordinate system:

$$Q = [Qx, Qy, Qz] = [u \cdot ex, vex, w \cdot ex],$$

which provides the scalar components for the sensor's "northward" orientation.

Figure 4D:
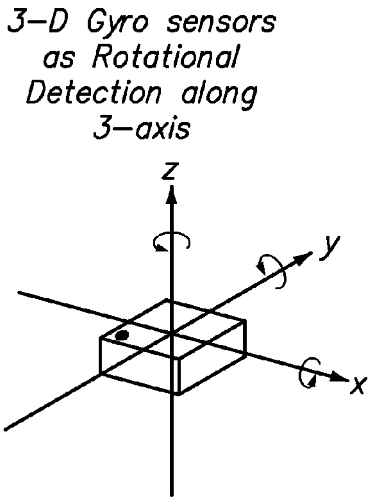

In using the N, P and Q vectors, we can calculate the absolute orientation angle of the sensor with respect to the earth global coordinate system. Accordingly as shown in FIG. 4D, we can derive the pitch, roll and heading of the sensor according to:

$$\text{Pitch} = \sin - 1(Pz)$$

$$\text{Roll} = \sin - 1(Qz)$$

$$\text{Heading} = \tan - 1(Py/Px).$$

With all combination of vectors derived from the above sensors are obtained and processed by the microcontroller 20 yields a relational motion of devices over a period of time. With the mathematical calculation within the microcontroller 20, the wand controller 10 determines the orientation of the device and predicts possible gestures as sequences of digitized points in space, in terms of command and alphanumerical characters.

Also, the vector relationship between sensors on each wand controller shown in FIG. 5 is calculated and yielded the relationship in term of angles how they are relative to earth surface based on the position and direction of individual wand to each other. This similarity can be obtained and derived for more wand controllers in the same system. In other embodiments, these can be sent over the internet for similar calculation to determine their relationships from two or more geographical areas.

In other embodiments, the wand controller of the present invention can include additional features.

For instance, a speaker controlled by audio indicator controller 46, to produce an audible sound representative of what a completed gesture sequence meant. For instance, an audible command could be received from another wand controller according to the present invention. In another instance, the "STOP" signal could be audibly sent to a pilot in an aircraft as a still additional safety measure.

A vibration motor, such as haptic feedback 48, which is controlled by ON-OFF pulse generated by microcontroller 20 to indicate the gesture sequence.

Figure 7:
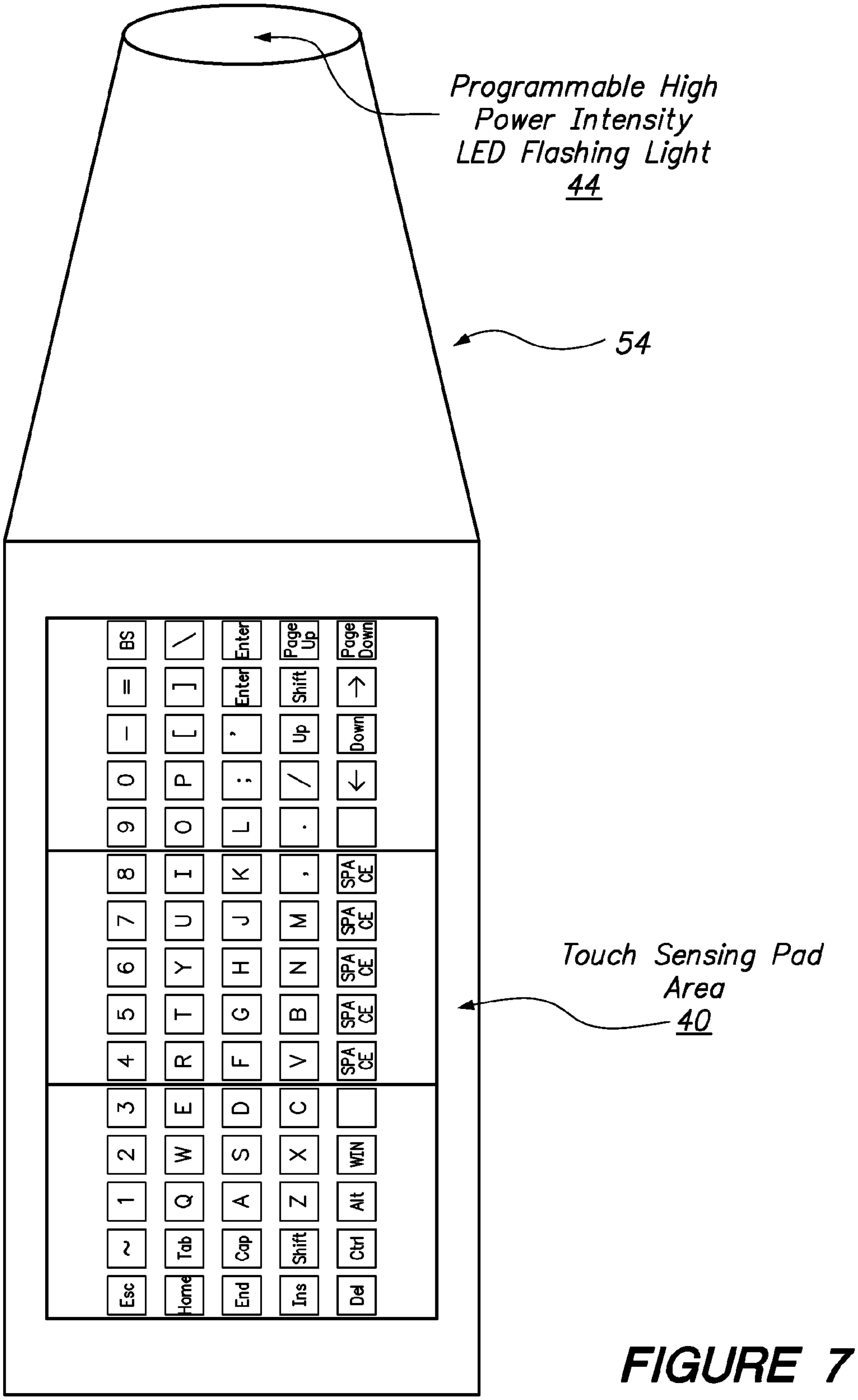
FIG. 7 shows a light traffic wand controller.

A touch keypad, such as keypad area 40 shown in FIG. 7, which allows the users to input text characters which may be used in the wand-to-wand direct communication applications (such as "texting" applications). The wand controller shown in FIG. 7 has a programmable high power intensity LED flashing light 44 with cone area 54 to provide visual marshaling instructions to a pilot.

As seen in FIGS. 1-8, the wand controller of the present invention is compatible to other portable device applications.

As the wand controller is moving in the 3-D or the air, sensors are acquiring data representative of the gesture motions. The sensed analog data is combined and processed to detect (generate) alpha-numerical characters, A . . . Z, and including 0, 1 . . . 9. The motion detection mechanism of the wand controller is also decoding proper gestures into meaningful commands. The generated data can then be sent to over the wireless network to a personal digital assistant (PDA), or including a computer, where it may be further processed or displayed.

The hardware unit is designed or integrated into many shapes and sizes to serve various applications, and can be designed to be compatible to personal digital devices (PDD), laptop or desktop computers.

FIG. 5 shows a pair of controller wands being used for marshalling gestures to a pilot for airplane moving instructions via a radio frequency link. A landing signal officer is shown in FIG. 5 with two single wands 10, in the left and right hands. The gesture motions are combined to create a pattern symbolic to direct airplane landing, moving or launching on an aircraft carrier.

A pair of wand controllers can be used for directing (marshalling) an airplane while on an aircraft carrier or land tarmac. These wand controller pairs are designed to send gesture signals directly to an airplane pilot via wireless link onto a cockpit display (monitor) to enable the pilot to visually see and couple both wand marshalling signaler and cockpit information for the extra safety measure of airplane maneuver over the aircraft carrier or tarmac.

In FIG. 7, a light traffic wand controller is integrated with hardware gesture detection unit and can be utilized as a traffic light remote control device. This wand controller in FIG. 7 also allows the user to text back and forth with other wand controller users as well, via wireless communication with touch sensing pad area 40.

Figure 8A:
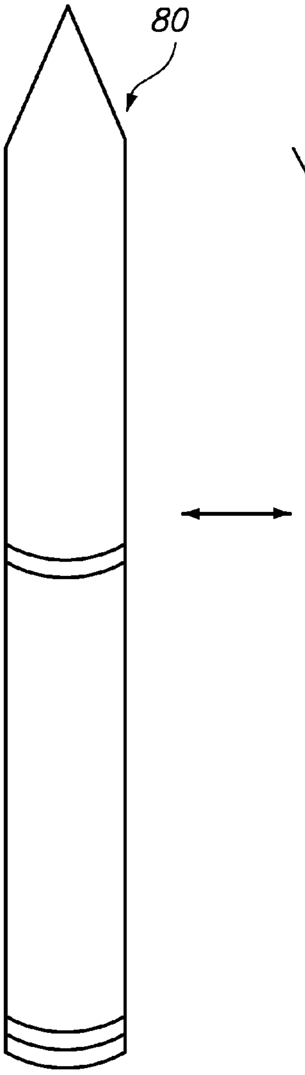
FIGS. 8A and 8B show a view of a wireless stylus pen, together with a block diagram, respectively.
Figure 8B:
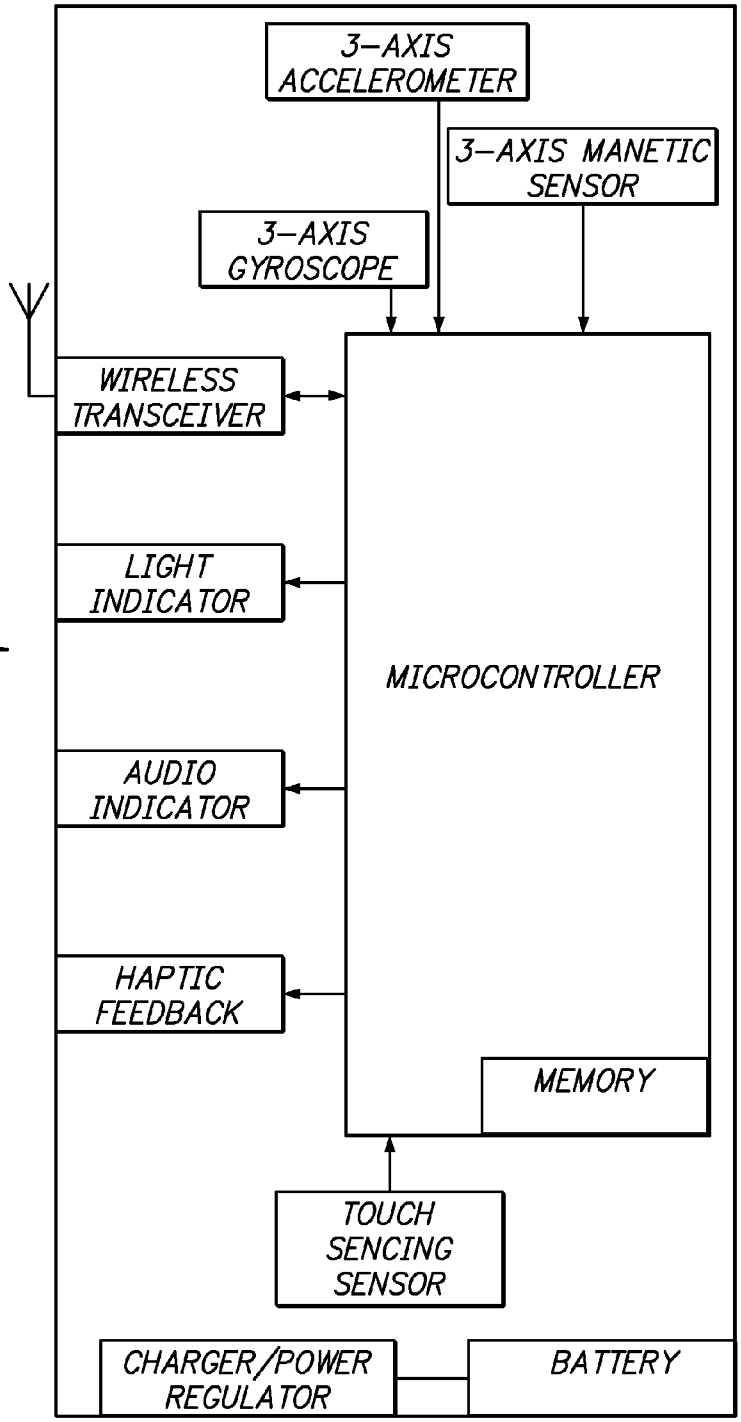

In FIG. 8, the wand controller is integrated and miniaturized with a similar set of circuit boards as described above into a wireless stylus-like pen 80 for detecting gestures of writing alpha-numeric character in the air. This device 80 detects when a user writes any alpha-numeric character in the air. The digitized data is sensed observed by 3-D sensors to realize the characters with onboard processing capability. This pen 80 then composes the sequence of characters into sentences or paragraphs, where these are stored onboard memory or sent directly over wireless network for other processing. In the embodiment shown in FIG. 8, there is no need for any writing pad to write these characters on. Rather, the user only "writes" in the air. In another embodiment, the wand controller device 80 can also be used as a number dialing device to a cellular phone via its wireless connection.

Figure 9:
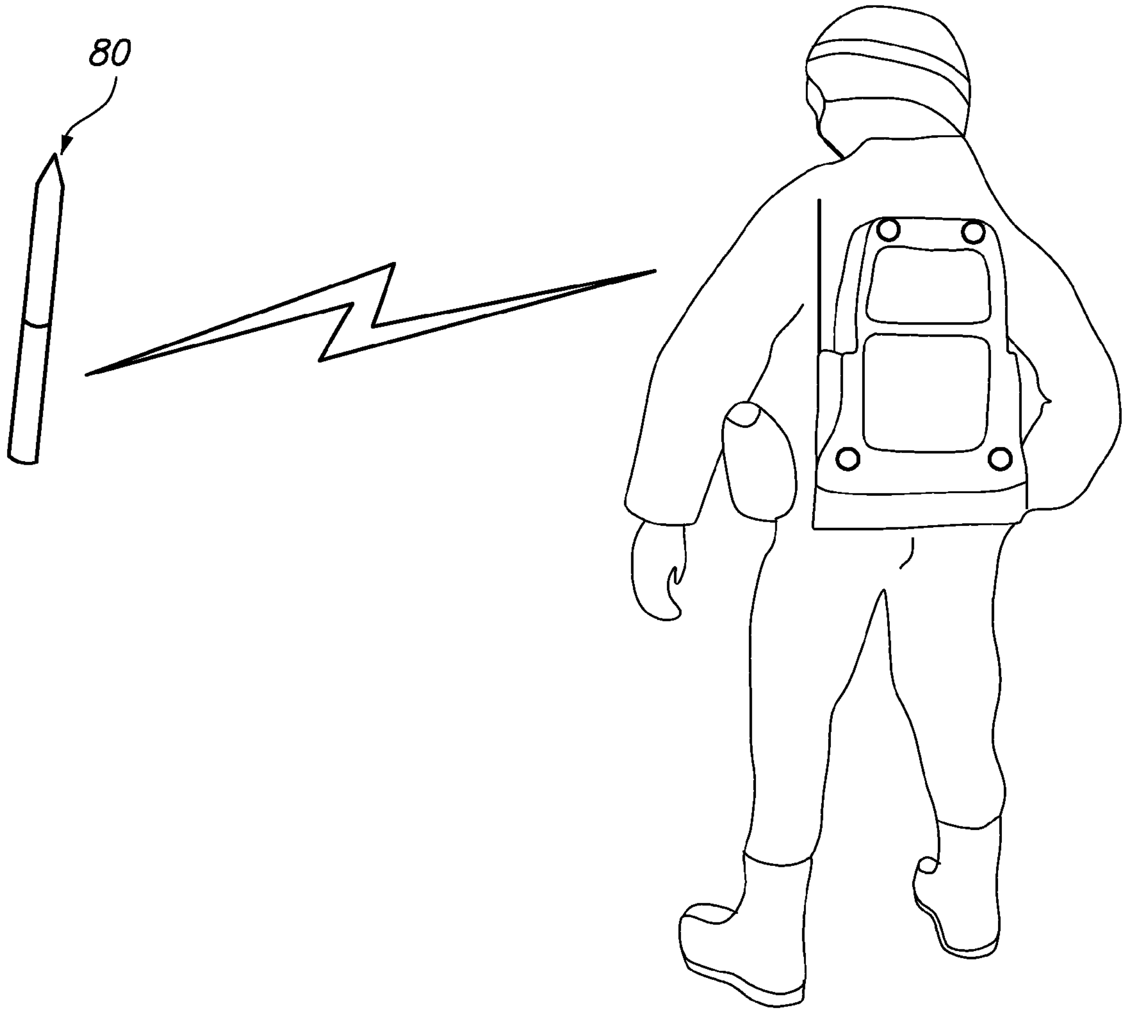
FIG. 9 shows a view of the wireless stylus pen of FIG. 8A, together with a view of manipulating a back-pack computer.

As shown in FIG. 9, another application is used for a Navy Seal Operation to wave the pen wand 80 in the dark for commands and controls the back-pack computers. In FIG. 9, a Navy Seal waves the wand controller 80 to manipulate the back-pack computer Another embodiment of the invention is to embed the wand controller onto a surgical scalpel. The scalpel-wand controller would be used in training medical students or aid the surgeon in their precision with incisions during surgery. Information on incision depths and locations on the body can all be wirelessly transmitted back to the surgeon as a feedback system.

Figure 10:
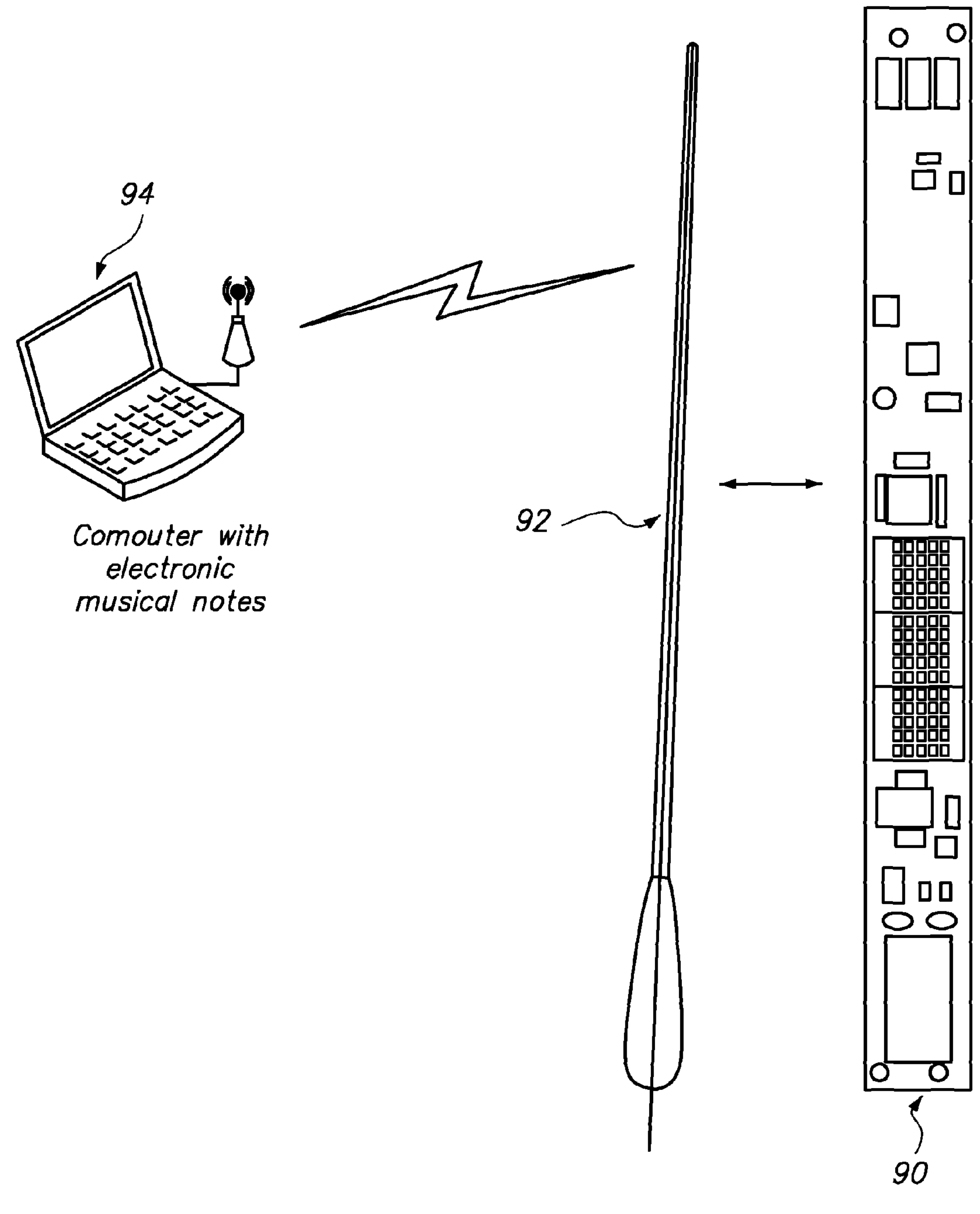
FIG. 10 shows a view of a wand controller of the present invention integrated for a music conductor.

In FIG. 10, the wand controller is integrated as a musical wand 92, from the embodiment disclosed as device 90. In such an application, a music conductor can synchronize the wand controller 92 with different instrumental groups of the orchestra, or transmitted/stored in a computer 94.

Figure 11:
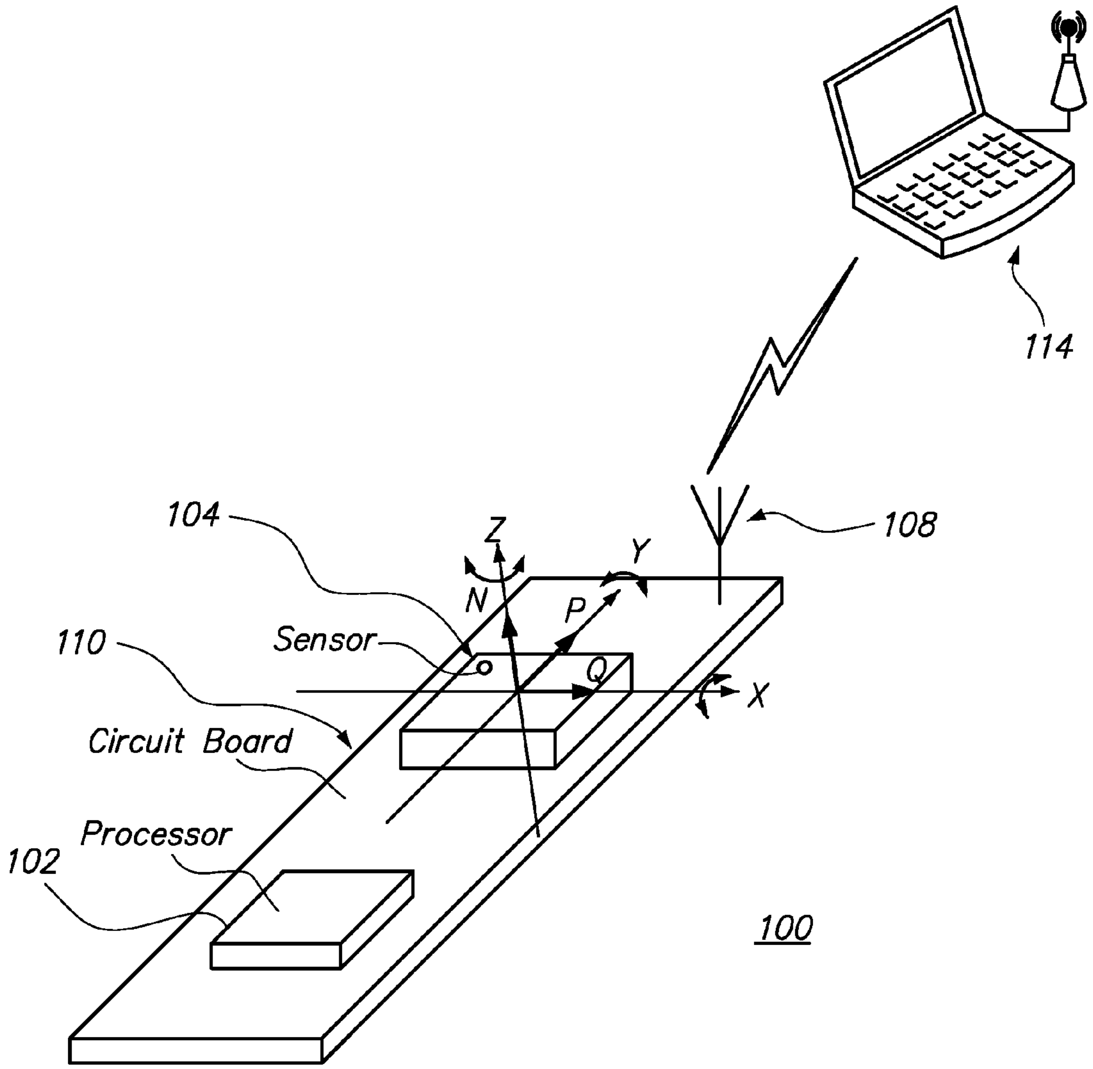
FIG. 11 shows a view of a wand controller of the present invention oriented relative to the earth surface.

FIG. 11 shows a view of a wand controller 100 oriented with the earth surface, embodying the present invention and including processor 102, sensor 104 and antenna 108, all placed on circuit board 110. The sensor 104 detects or senses the motion of the wand controller in three dimensions (X, Y, Z axes) in accordance with the above descriptions, where the unit vectors Q, P, N represent the X, Y, Z axes, respectively, and where antenna 108 transmits that sensed information to computer 114, as an example, for further processing.

Figure 12:
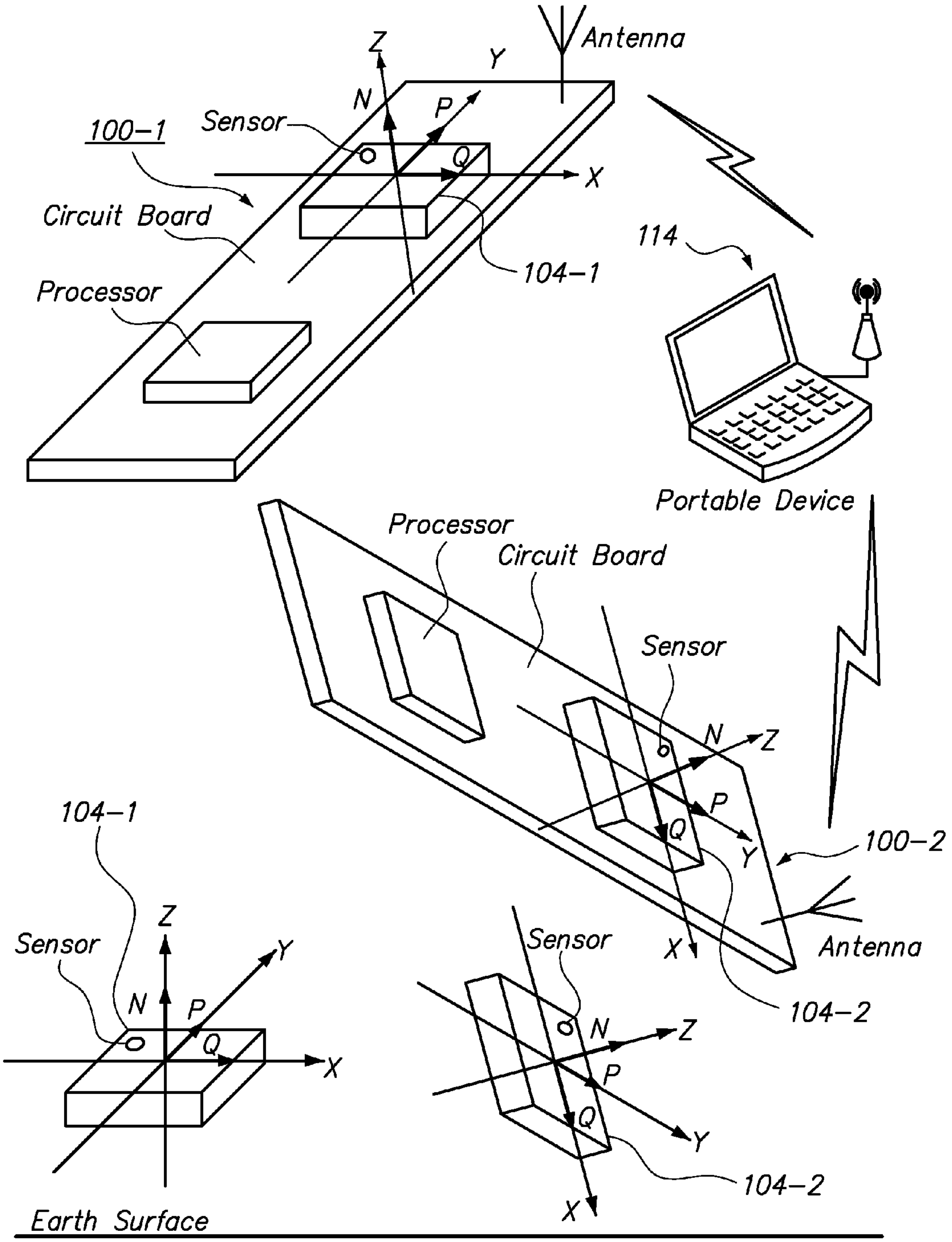
FIG. 12 shows a view of a pair of wand controllers with sensors moving in space in terms of unit vectors.

FIG. 12 shows a pair of wand controllers 100-1, 100-2 of FIG. 11 shown with sensors 104-1, 104-2 moving in space with respect to the earth's surface, again providing sensed motion gestures in accordance with the above descriptions which are transmitted to a computer (e.g., a portable device) 114 for further processing.

Figure 13:
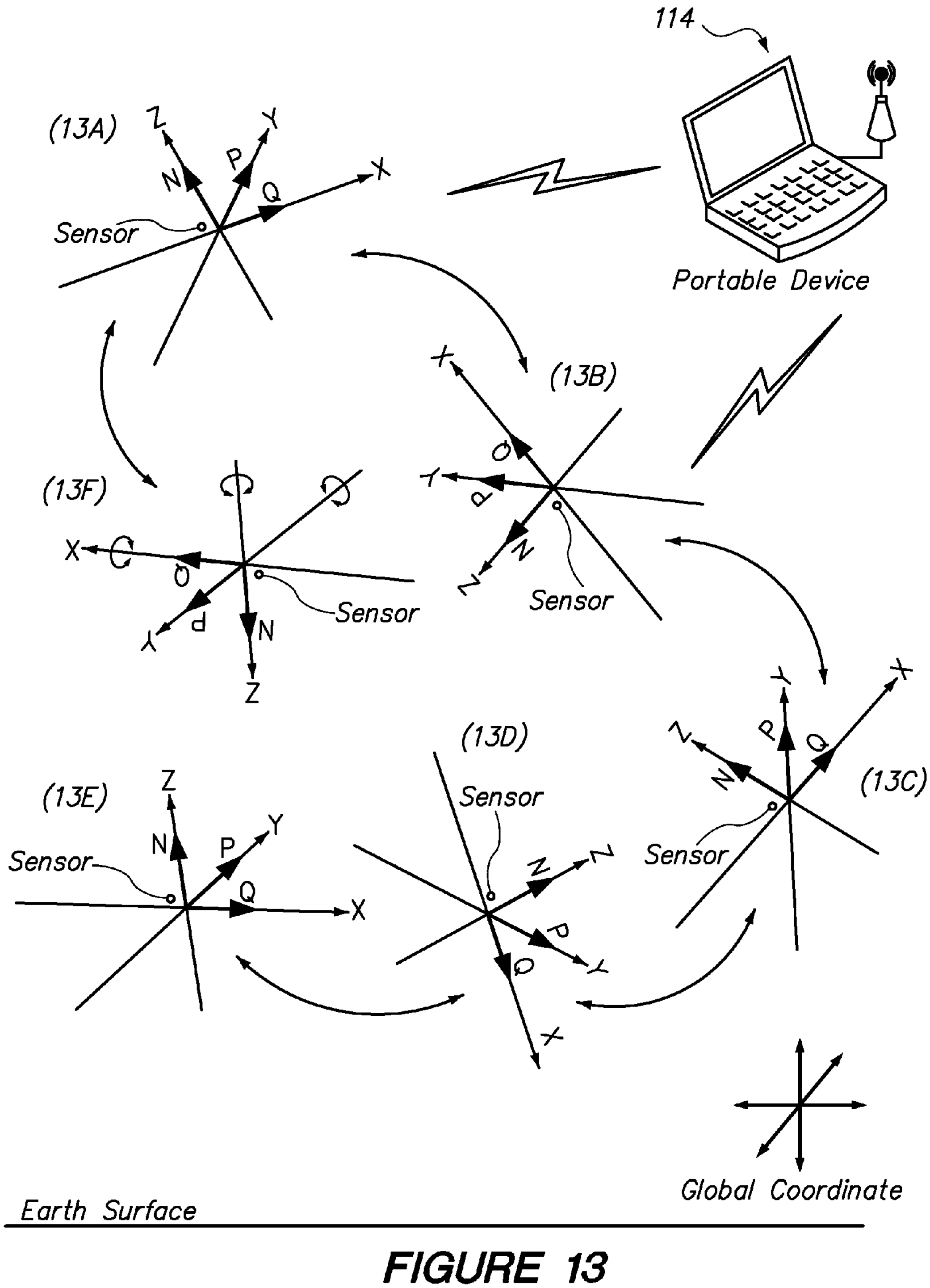
FIG. 13 shows a view of sensors of the wand controller moving in space relative to global coordinates as vector representations.

FIG. 13 shows the vectors NPQ of the sensors 104 of FIGS. 11-12 moving in space relative to global coordinates as vector representations. Like all vectors, unit vectors NPQ can be moved anywhere in coordinate space such as shown in FIGS. 13A-13F, providing sensed motion gesture information such as translational, rotational and acceleration information.

The sensed gesture motion information would correspond to the three dimensional sensor information detected by gyroscope 34, accelerometer 36 and magnetic sensor 30, as has been previously described in conjunction with the block diagram of a wand controller 10 shown in FIG. 1.

In FIG. 13, various sensed motions in NPQ unit vector representations are shown from FIGS. 13A to 13B, from 13B to 13C, from 13C to 13D, from 13D to 13E, and from FIGS. 13A to 13E. These sensed gesture motions are transmitted to computer 114 for further processing in accordance with the above descriptions of the present invention.

From the above description, it is apparent that various techniques may be used for implementing the concepts of the present invention without departing from its scope. The described embodiments are to be considered in all respects as illustrative and not restrictive. It should also be understood that system is not limited to the particular embodiments described herein, but is capable of many embodiments without departing from the scope of the claims.

What is claimed is:

1. An aircraft marshaling wand controller comprising:

motion sensors for sensing three dimensional gesture motions of a user to form sensed gesture motion signals representing aircraft marshal commands corresponding to the gesture motions of the user for transmission to a display monitor on the aircraft;

a processor for digitizing the sensed gesture motion signals to form digitized command signals representative of the aircraft marshal commands of the sensed gesture motion signals, a wireless transceiver for transmitting the digitized command signals for display on the display monitor on the aircraft, and an audio indicator for indicating audio signals when a motion gesture is completed.

2. The wand controller of claim 1 wherein the motion sensors include a gyroscope sensor for detecting the orientation of the gesture motion signals, an accelerometer sensor for detecting the acceleration motion of the gesture motion signals, and a magnetometer sensor for detecting the relative attitude and heading of the gesture motion signals.

3. The wand controller of claim 2 including the processor comparing the sensed gesture motion signals with stored predetermined gesture information representative of various aircraft marshaling instructions and generating command signals representative of specific aircraft marshaling commands.

4. The wand controller of claim 2 including a light indicator for indicating light signals.

5. The wand controller of claim 2 including a light indicator for indicating different colored light signals.

6. The wand controller of claim 1 including a haptic feedback circuit for indicating tactile signals when a motion gesture is competed.

7. The wand controller of claim 6 including a touch sensor for indicating input text characters.

8. A wand controller comprising motion sensors for sensing three dimensional gesture motions of a user to form sensed gesture motion signals representing motion commands corresponding to the spatial point gesture motions of the user;

a processor for digitizing the sensed gesture motion signals to form digitized command signals representative of the sensed gesture motion signals;

a wireless transceiver for transmitting the digitized command signals and for receiving other digitized command signals; and an audio indicator for indicating audio signals when a motion gesture is completed.

9. The wand controller of claim 8 wherein the motion sensors include a gyroscope sensor for detecting the orientation of the gesture motion signals, an accelerometer sensor for detecting the acceleration motion of the gesture motion signals, and a magnetometer sensor for detecting the relative attitude and heading of the gesture motion signals.

10. The wand controller of claim 9 including the processor comparing the sensed gesture motion signals with stored predetermined gesture information representative of various instructions and generating command signals representative of specific commands.

11. The wand controller of claim 9 wherein the wand controller is an aircraft marshaling wand controller.

12. The wand controller of claim 9 wherein the wand controller is a texting device.

13. The wand controller of claim 9 wherein the wand controller is a stylus pen.

14. The wand controller of claim 9 wherein the wand controller is a music wand.

15. The wand controller of claim 9 wherein the wand controller is a surgical scalpel.

16. A method for controlling a wand controller, the method comprising the steps of:

sensing three dimensional gesture motions of a user to form sensed gesture motion signals representing motion commands corresponding to the spatial point gesture motions of the user;

digitizing the sensed gesture motion signals to form digitized command signals representative of the sensed gesture motion signals;

transmitting the digitized command signals and for receiving other digitized command signals; and indicating audio signals when a motion gesture is completed.

* * * * *